(12) United States Patent
Yamada

(10) Patent No.: US 7,586,201 B2
(45) Date of Patent: Sep. 8, 2009

(54) WIRING MODELING TECHNIQUE

(75) Inventor: Kenta Yamada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 1977 days.

(21) Appl. No.: 10/252,610

(22) Filed: Sep. 24, 2002

(65) Prior Publication Data

US 2003/0057571 A1 Mar. 27, 2003

(30) Foreign Application Priority Data

Sep. 27, 2001 (JP) .............................. 2001/295987

(51) Int. Cl.
*H01L 23/52* (2006.01)

(52) U.S. Cl. .......................................... 257/786; 716/5

(58) Field of Classification Search ................. 257/786; 716/5

See application file for complete search history.

(56) References Cited

U.S. PATENT DOCUMENTS 6,505,334 B1 * 1/2003 Tanaka ......................... 716/13
6,516,455 B1 * 2/2003 Teig et al. ...................... 716/7

* cited by examiner

*Primary Examiner*—David Nelms
*Assistant Examiner*—Tu Ho
(74) *Attorney, Agent, or Firm*—Sughrue Mion, PLLC

(57) ABSTRACT

In a semiconductor device having wirings, a wiring modeling technique according to the present invention comprises the steps of selecting an arbitrary region of the semiconductor device; calculating a wiring area ratio of the wirings to the region; and determining the region and the wiring area ratio to model the cross-sectional profile of a target wiring located in the middle of the region.

6 Claims, 16 Drawing Sheets

TEST PATTERN 1    NUMBER OF CELLS: 35 x 14=490

35 COMBINATIONS FOR W/S

| | | | | | | | | |
|---|---|---|---|---|---|---|---|---|
| 9.6 | — | — | — | — | — | * | * | * |
| 6.4 | — | — | — | — | * | — | * | * |
| 3.2 | — | — | — | * | * | — | * | * |
| 1.6 | — | * | — | * | * | — | * | * |
| 0.8 | * | * | — | * | * | — | * | * |
| 1.48 | * | — | — | — | — | — | — | — |
| 0.4 | * | * | — | * | * | — | * | * |
| 0.24 | * | * | * | * | * | — | * | * |
| W/S | 0.24 | 0.4 | 0.48 | 0.8 | 1.6 | 2.4 | 3.2 | 6.4 |

14 COMBINATIONS FOR X/Y

| | | | | | | | |
|---|---|---|---|---|---|---|---|
| 1000 | — | — | — | — | — | — | * |
| 500 | * | * | * | * | * | * | — |
| 100 | — | — | — | — | * | — | — |
| 50 | * | * | * | * | — | — | — |
| 20 | — | * | — | — | — | — | — |
| 10 | — | * | — | — | — | — | — |
| 2 | — | — | — | — | — | — | — |
| Y/X | 2 | 10 | 20 | 50 | 100 | 500 | 1000 |

FIG.5

TEST PATTERN 2    NUMBER OF CELLS: 17 x 15 x 5=1275

17 COMBINATIONS FOR W/S

| | | | | | | | | |
|---|---|---|---|---|---|---|---|---|
| 9.6 | — | — | — | — | — | — | — | — |
| 6.4 | — | — | — | — | — | — | — | — |
| 3.2 | — | — | — | — | — | — | — | — |
| 1.6 | — | * | — | * | * | — | — | — |
| 0.8 | * | * | — | * | * | — | — | — |
| 1.48 | * | — | — | — | — | — | — | — |
| 0.4 | * | * | — | * | * | — | — | — |
| 0.24 | * | * | * | * | * | — | — | — |
| W/S | 0.24 | 0.4 | 0.48 | 0.8 | 1.6 | 2.4 | 3.2 | 6.4 |

15 COMBINATIONS FOR X/Y

| | | | | | | | |
|---|---|---|---|---|---|---|---|
| 1000 | — | — | — | — | — | — | — |
| 500 | * | * | * | * | * | — | — |
| 100 | — | — | — | — | — | — | — |
| 50 | * | * | * | * | * | — | — |
| 20 | — | — | — | — | — | — | — |
| 10 | * | * | * | * | * | — | — |
| 2 | — | — | — | — | — | — | — |
| Y/X | 2 | 10 | 20 | 50 | 100 | 500 | 1000 |

5 COMBINATIONS FOR W2/S2

| | | | |
|---|---|---|---|
| 0.96 | * | — | — |
| 0.48 | * | — | — |
| 0.24 | * | * | * |
| W2/S2 | 0.24 | 0.48 | 0.96 |

FIG.6

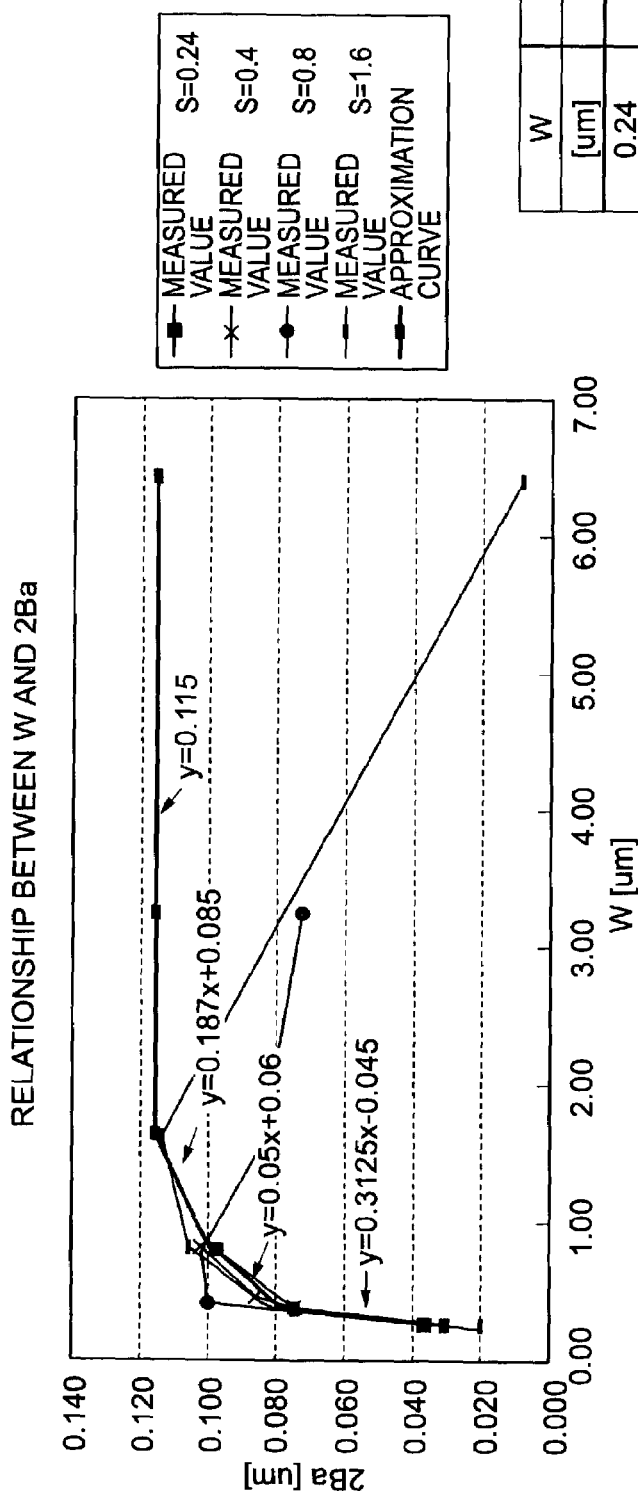

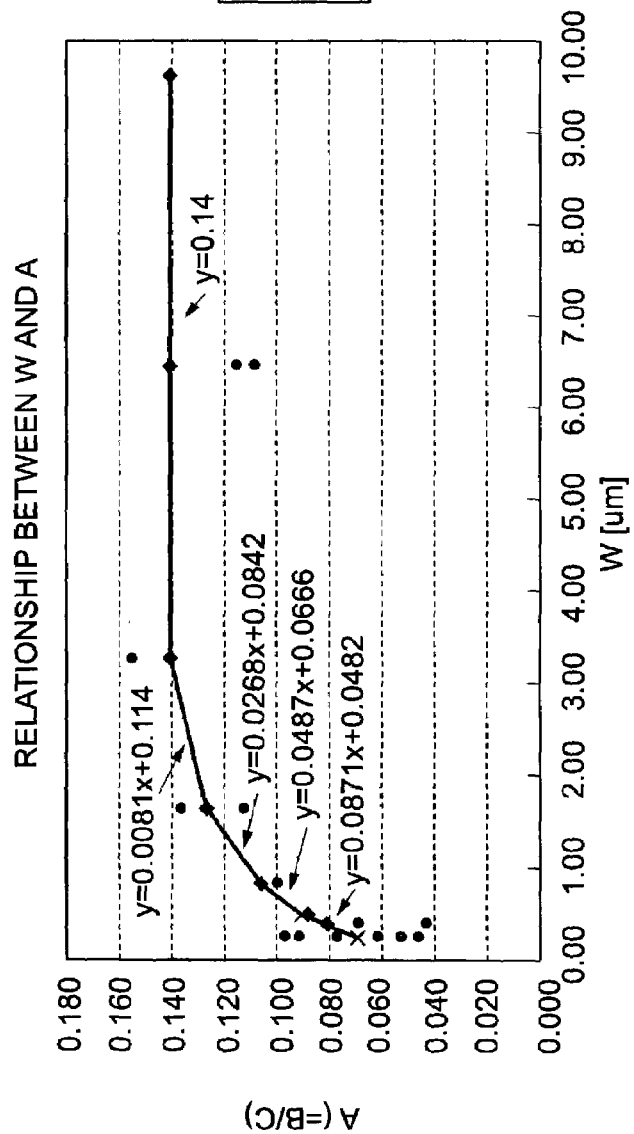

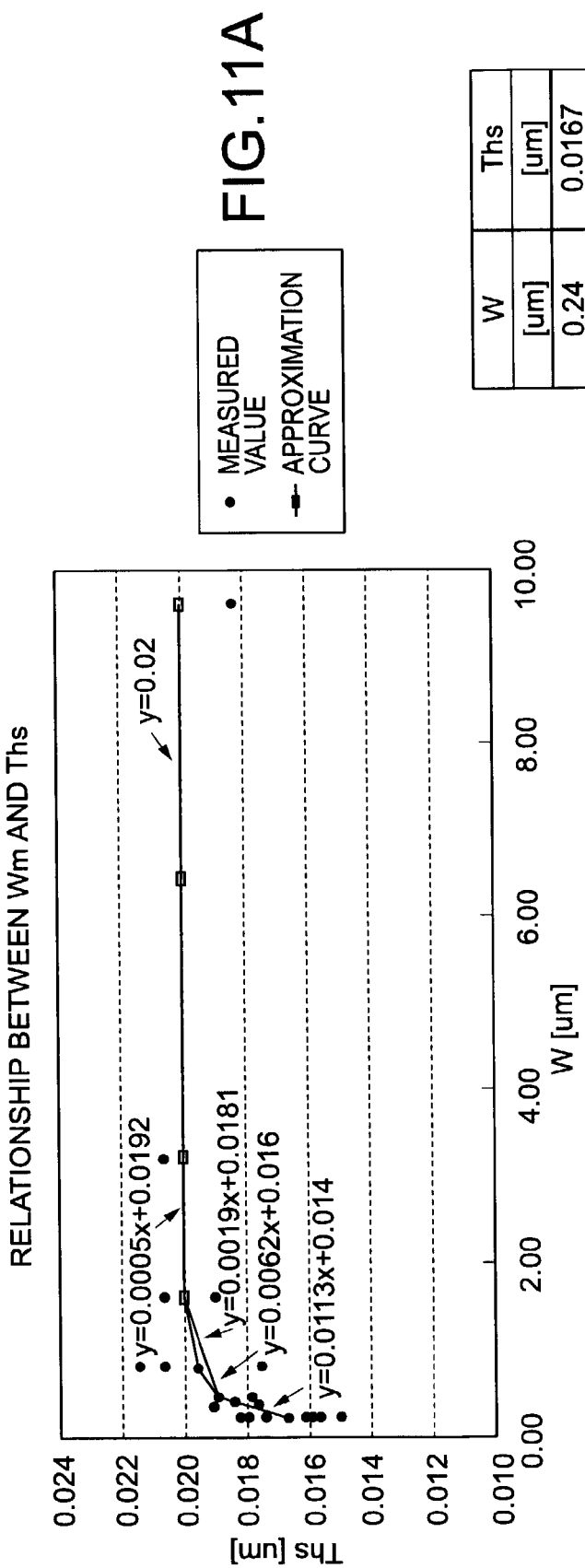
FIG. 11A  Relationship between Wm and Ths
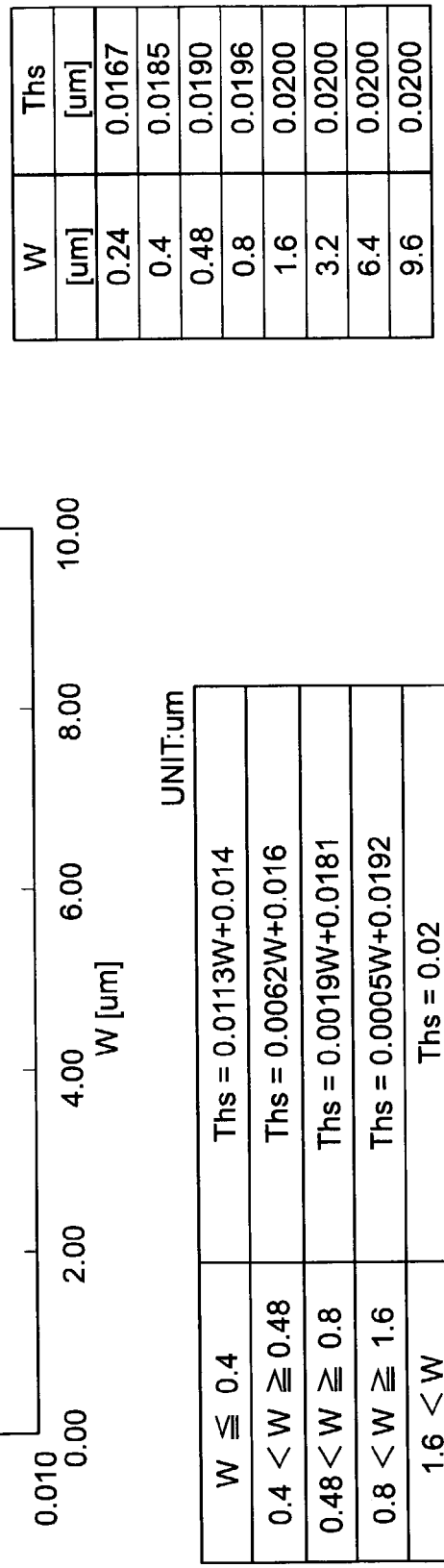
FIG. 11B
UNIT: μm
| W ≦ 0.4 | Ths = 0.0113W + 0.014 |
|---|---|
| 0.4 < W ≦ 0.48 | Ths = 0.0062W + 0.016 |
| 0.48 < W ≦ 0.8 | Ths = 0.0019W + 0.0181 |
| 0.8 < W ≦ 1.6 | Ths = 0.0005W + 0.0192 |
| 1.6 < W | Ths = 0.02 |
FIG. 11C
| W [μm] | Ths [μm] |
|---|---|
| 0.24 | 0.0167 |
| 0.4 | 0.0185 |
| 0.48 | 0.0190 |
| 0.8 | 0.0196 |
| 1.6 | 0.0200 |
| 3.2 | 0.0200 |
| 6.4 | 0.0200 |
| 9.6 | 0.0200 |

| | UNIT:um |
|---|---|
| W ≦ 0.4 | Thb = 0.0176W+0.0176 |
| 0.4 < W ≧ 0.8 | Thb = 0.0066W+0.022 |
| 0.8 < W ≧ 1.6 | Thb = 0.0017W+0.0259 |
| 1.6 < W ≧ 3.2 | Thb = 0.0003W+0.0282 |
| 3.2 < W | Thb = 0.0292 |

| W [um] | Thb [um] |
|---|---|
| 0.24 | 0.0218 |
| 0.4 | 0.0247 |
| 0.48 | 0.0252 |
| 0.8 | 0.0273 |
| 1.6 | 0.0287 |
| 3.2 | 0.0292 |
| 6.4 | 0.0292 |
| 9.6 | 0.0292 |

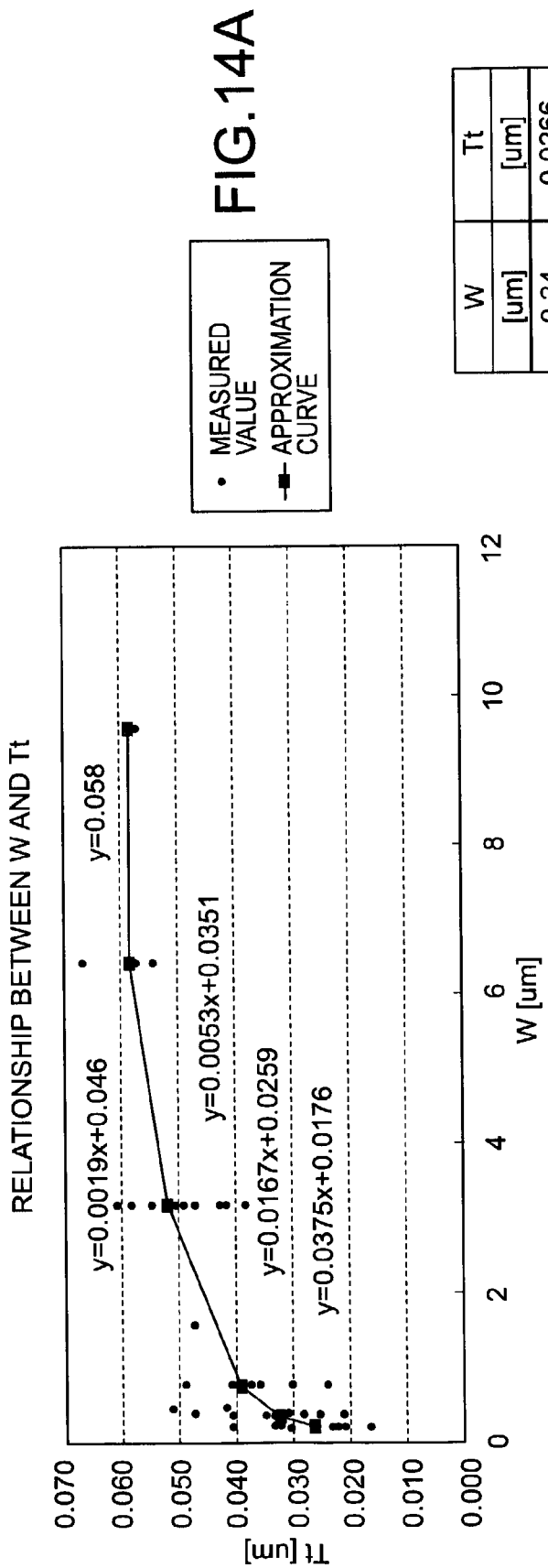

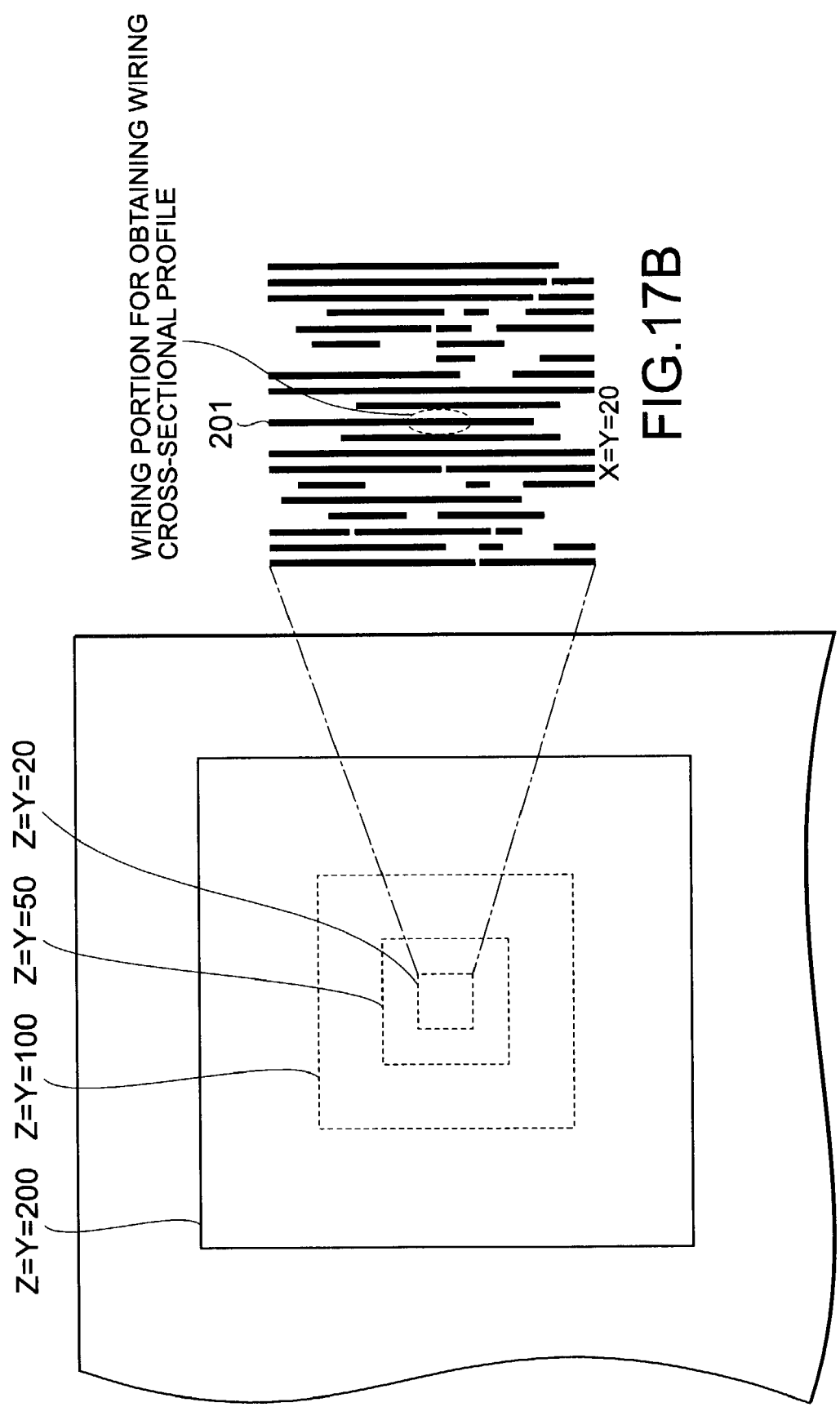

WIRING MODELING TECHNIQUE

BACKGROUND OF THE INVENTION

1. Field of the Invention

The present invention relates to a wiring modeling technique.

2. Description of the Prior Art

With increasingly higher degrees of integration and higher densities of semiconductor devices, the width of wirings formed on a semiconductor device chip and the spacing between adjacent wirings (hereinafter referred to as wiring spacing) have become finer and finer. Since such higher degrees of integration and higher densities and hence increased wiring capacities and wiring resistances have produced longer signal delays, it is essential to semiconductor device design to accurately estimate these signal delay factors.

In addition, as a result of such finer wirings, a discrepancy between a manufacturing aim for wiring cross-sectional profile and the cross-sectional profile of a wiring actually formed on a chip has an increased influence on the wiring capacitance and the wiring resistance. The term "manufacturing aim" used herein refers to making a wiring of rectangular cross-sectional profile, forming a wiring width according to a layout, and making the wiring thickness uniform throughout a chip. This discrepancy depends on and varies with the wiring width and the wiring spacing of that wiring, and a layout condition of other wirings around that wiring within a region where that wiring is formed.

When a conductor of much higher resistivity than a principal material of the wiring is partly used within the wiring, a wiring capacitance estimate depends on the surface shape of the wiring but a wiring resistance estimate depends on the cross-sectional profile of the wiring. In particular, when the wiring consists of a plurality of metal materials, the wiring resistance estimate would depend on the cross-sectional profile of a portion made of a principal metal material, and thus, the wiring capacitance and wiring resistance estimates should depend on different factors, respectively.

With prior wiring capacitance and wiring resistance estimation methods, however, on the assumption that all wirings are formed according to the manufacturing aim and also that the cross-sectional profile for wiring capacitance estimation is identical to that for wiring resistance estimation, the wiring capacitance and the wiring resistance would be calculated. Consequently, there may be an error between a signal delay actually occurring on a chip and a signal delay estimated from the calculated wiring capacitance and wiring resistance, resulting in a problem that the actual chip may not operate normally.

To solve these problems, it is essential in estimating the wiring capacitance and wiring resistance of each wiring actually formed on a chip to accurately reflect its cross-sectional profile which depends on the wiring width and the wiring spacing of that wiring, and the layout condition of other wirings around that wiring and which deviates from the manufacturing aim. In addition, it is necessary to separately calculate the cross-sectional profile for wiring capacitance estimation and the cross-sectional profile for wiring resistance estimation. In some cases, it may be necessary to correct the manufacturing aim itself with respect to the wiring width in advance during the mask design stage for correction of the above-mentioned error.

BRIEF SUMMARY OF THE INVENTION

Object of the Invention

It is an object of the present invention to provide a wiring modeling technique which allows for accurate prediction of wiring resistance and wiring capacitance in designing a semiconductor device and which allows for feedback to the design.

SUMMARY OF THE INVENTION

In a semiconductor device having wirings, a wiring modeling technique according to the present invention comprises the steps of selecting a region of the semiconductor device; calculating a wiring area ratio of the wirings to the region; and determining the region and the wiring area ratio to model the cross-sectional profile of a target wiring located in the middle of the region.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 5 is a parameter table for defining the wiring test pattern 1;

FIG. 6 is a parameter table for defining the wiring test pattern 2;

FIGS. 9A to 9C show a graph, model equations, and a table model for showing how a parameter Ba used for the embodiment of the present invention varies with wiring width W;

FIGS. 10A to 10C show a graph, model equations, and a table model for showing how a parameter A used for the embodiment of the present invention varies with wiring width W;

FIGS. 11A to 11C show a graph, model equations, and a table model for showing how a parameter Ths used for the embodiment of the present invention varies with wiring width W;

FIGS. 14A to 14C show a graph, model equations, and a table model for showing how a parameter Tt used for the embodiment of the present invention varies with wiring width W;

FIGS. 17A and 17B show a chip layout for explaining the process of determining the wiring data region and data ratio used for the embodiment of present invention;

DETAILED DESCRIPTION OF THE PREFERRED EMBODIMENTS

Figure 1:
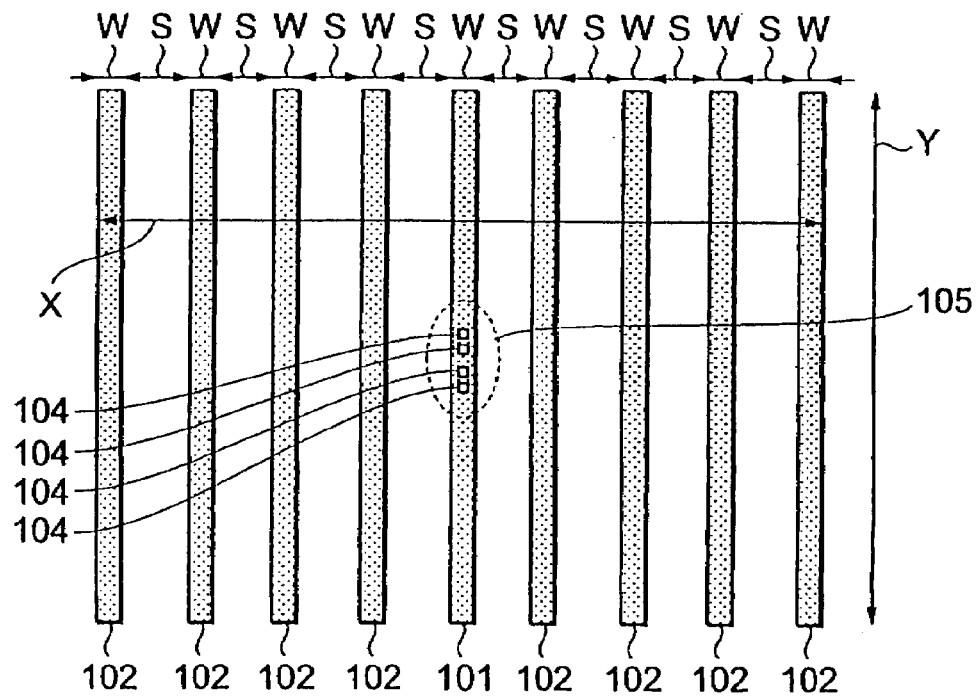
FIG. 1 is a plan view of a wiring test pattern 1 used for an embodiment of the present invention.
Figure 2:
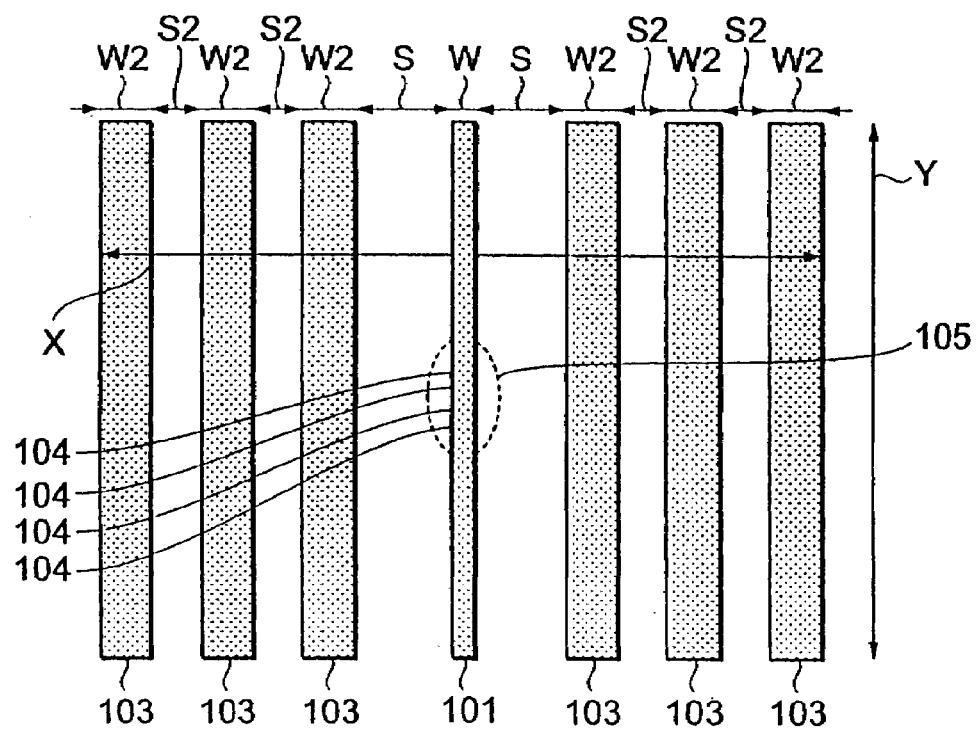
FIG. 2 is a plan view of a wiring test pattern 2 used for the embodiment of the present invention.

The embodiment of the present invention will be described below in detail with reference to the drawings. First, test patterns used for extracting a wiring cross-section model will be described. FIGS. 1 and 2 are plan views for such test patterns, respectively.

FIG. 1 shows a test pattern in which a copper wiring 101 with wiring width W and length Y to be measured with respect to resistance and cross-sectional profile is located in the middle of a region with width X and other copper wirings 102 are laid with wiring spacing S on both side thereof in the remaining portion of the region. In this test pattern region X×Y, the ratio of the wirings to the total area of the region is called the data ratio D for this test pattern. This test pattern is provided with the aim of examining how the parameters W, S, X, Y, and D for each pattern affect the cross-sectional profile of the wiring in the middle portion of the pattern. The relationship between the copper wiring 101 to be measured and the other copper wirings 102 will constitute a layout condition of other wirings around a target wiring on an actual semiconductor chip.

Then, a plurality of test patterns having varying values of the parameters W, S, X, Y, and D are laid out on a test chip. FIG. 2 shows another test pattern in which a copper wiring 101 with wiring width W and length Y to be measured with respect to resistance and cross-sectional profile is located in the middle of a region with width X and other copper wirings 103 with wiring width W2 and length Y are laid with wiring spacing S2 symmetrically on both side thereof in the remaining portion of the region, the two wirings 103 nearest to the wiring 101 being located at a distance of wiring spacing S therefrom. In this test pattern region X×Y, the ratio of the wirings to the total area X×Y of the region is called the data ratio D for this test pattern.

This test pattern is provided with the aim of examining how the parameters W, S, W2, S2, X, Y, and D for each pattern affect the cross-sectional profile of the wiring in a resistance measuring portion. The relationship between the copper wiring 101 to be measured and the other copper wirings 103 will constitute a layout condition of other wirings around a target wiring on an actual semiconductor chip again. Then, a plurality of test patterns having varying values of the parameters W, S, W2, S2, X, Y, and D are laid out on the same test chip as that for the test pattern of FIG. 1. The test pattern of FIG. 1 is hereinafter referred to as test pattern 1, the test pattern of FIG. 2 is referred to as test pattern 2, and the test pattern 1 and the test pattern 2 are collectively referred to as test pattern. FIGS. 5 and 6 are parameter tables for showing various value combinations for the parameters W, S, W2, S2, X, Y, and D and the symbol "*" indicates that the marked combination exists in the test pattern.

FIG. 5 shows 35 value combinations for the parameters W and S as well as 14 value combinations for the parameters X and Y and thus, the test pattern 1 may take 35×14=490 forms in total. FIG. 6 shows value combinations for the parameters based on a similar concept and thus, the test pattern 2 may take 17×15×5=1275 forms.

For the test patterns of FIGS. 1 and 2, each test pattern is located at a sufficient distance from other test patterns on a wafer to avoid any influence of adjacent test patterns on the cross-sectional profile of a wiring. Specifically, other adjacent test patterns must be kept out of a rectangular region obtained by enlarging the region for each pattern by X/3 times in width and by Y/3 times in length. In order to measure the wiring resistance in the middle portion of a wiring located in the middle of each test pattern, a resistance measuring portion is provided as described below.

Figure 3:
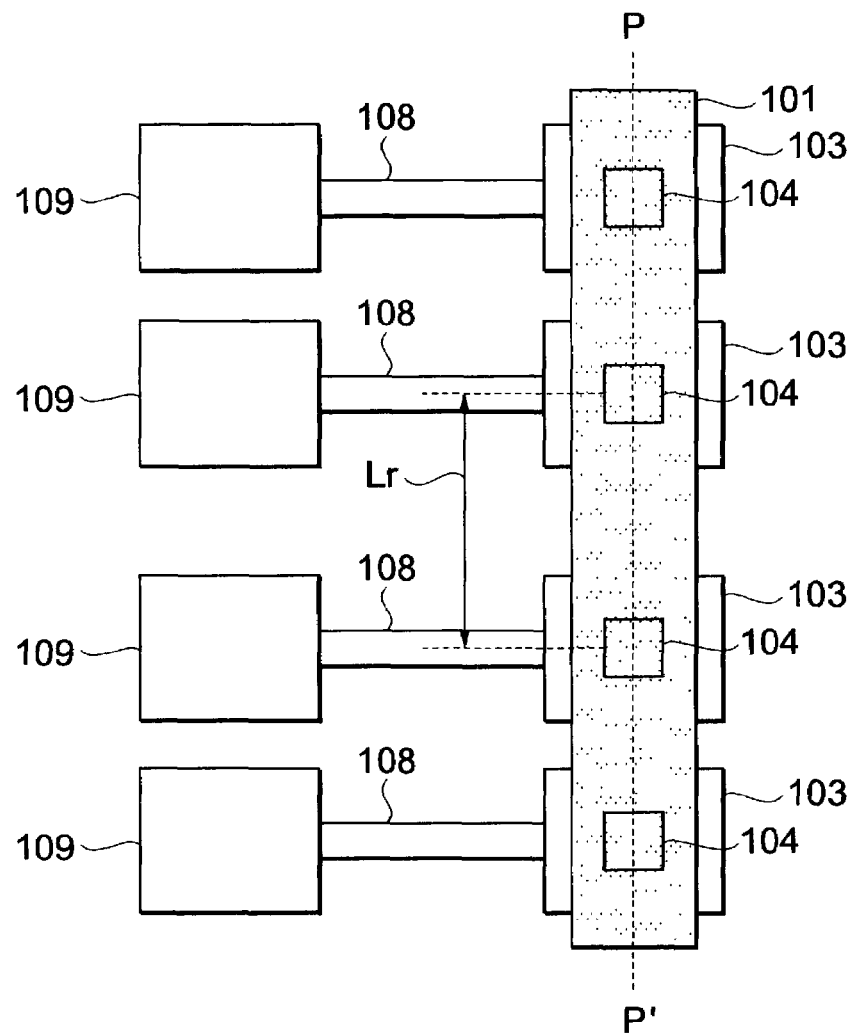
FIG. 3 is an enlarged plan view of a resistance measuring portion of the measured wiring pattern among wiring test patterns used for the embodiment of the present invention.
Figure 4:
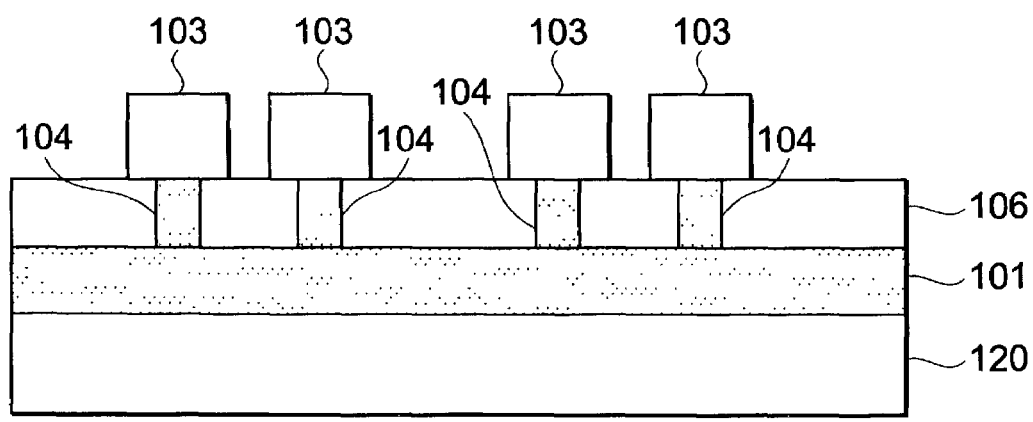
FIG. 4 is a sectional view taken along the line P-P' in FIG. 3.

FIG. 3 is an enlarged view of the resistance measuring portion 105 in FIGS. 1 and 2 and FIG. 4 is a sectional view of an actual chip taken along the dotted line P-P' in FIG. 3. FIG. 4 is a simplified view on the assumption that the wiring geometry has been made according to the manufacturing aim. In this embodiment, to avoid any influence of other wirings outside an intended layout pattern on the cross-sectional profile of a wiring to be measured, after a copper wiring has been formed on a substrate 120 as shown in FIGS. 3 and 4, via holes 104 are formed in an interlayer insulator film 106 and measurement wirings 103 are formed thereon. Wirings 108 and probing pads 109 are formed from the measurement wirings in the same manner as for the measurement wirings so that a four-terminal Kelvin measurement can be performed to measure the resistance. This may prevent the wiring to be measured from being affected by the manufacture of leader wirings and probing pads used to measure the wiring resistance, because, the leader wirings and probing pads are manufactured by a different process from that for the wiring to be measured.

In addition, since the wiring resistance is measured through four-terminal Kelvin measurement, any parasitic resistance in a cable for a measuring apparatus, probing needles, the leader wirings 108 and the via holes 104 can be cancelled, so that resistance can be measured only for a wiring with wiring length Lr to be measured.

To extract only the wiring resistance at the middle portion, the measurement wiring length Lr should be sufficiently smaller than the value Y. Specifically, the length Lr should be equal to or smaller than ⅔ of Y. It is desirable that the value Lr be smaller with respect to the resolution of the resistance measuring apparatus to such an extent that no measurement problem may arise. The structure of leader wirings is specifically designed such that the two inner leader wirings of the four ones are located at an equal distance from the center of the measurement wiring.

Next, data collection will be described below.

All test patterns actually formed on a chip are subject to the four-terminal Kelvin measurement to measure the wiring resistance in the middle portion of the patterns.

The cross sections of middle portions to be measured with respect to wiring resistance of the order of 40 to 50 representative patterns are observed with SEM or the like to measure the cross-sectional profile dimensions of the wiring. The representative patterns are selected such that the parameters W, S, W2, S2, X, Y, and D can assume various values.

Figure 7:
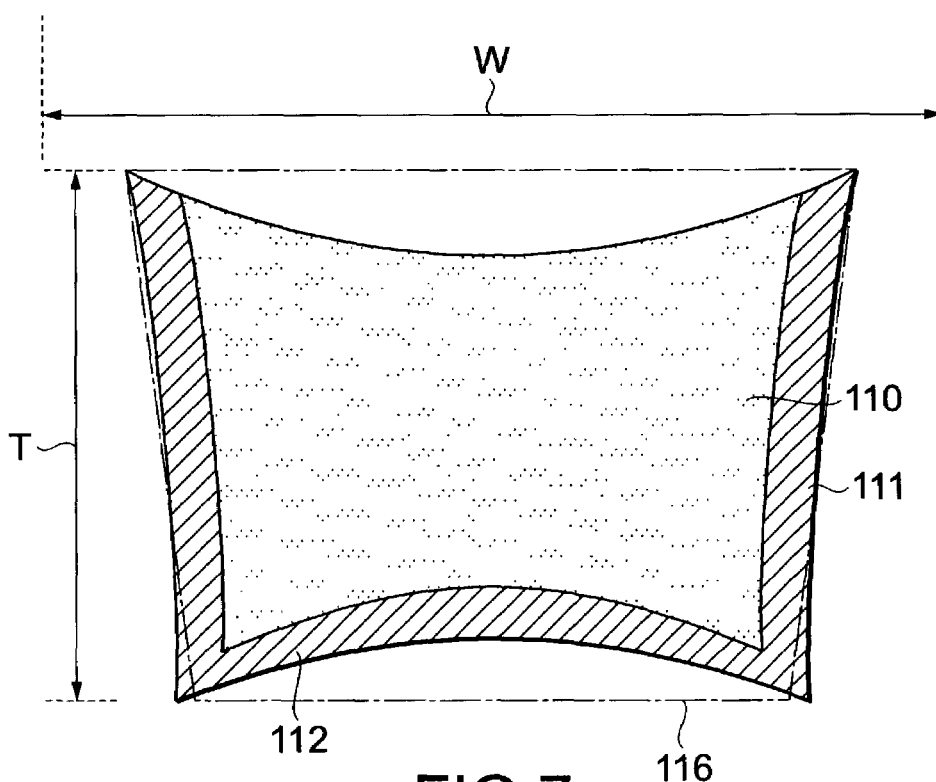
FIG. 7 shows a cross-sectional profile obtained by measuring the cross section of an actual wiring.
Figure 8:
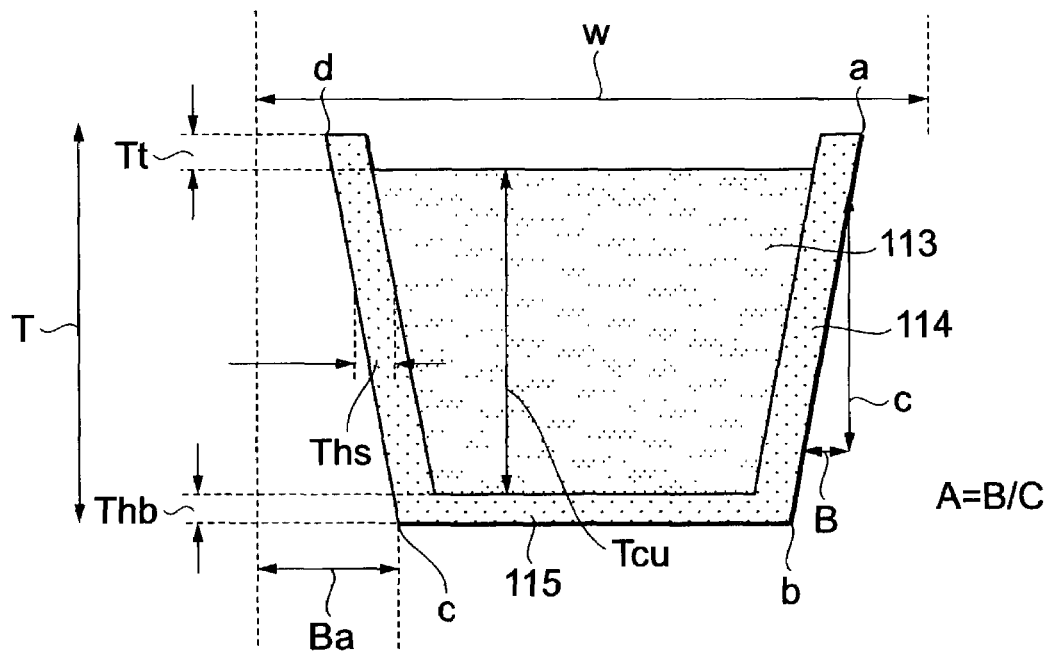
FIG. 8 shows a cross-sectional profile model of a wiring used for the embodiment of the present invention.
Figures 12A, 12B, 12C:
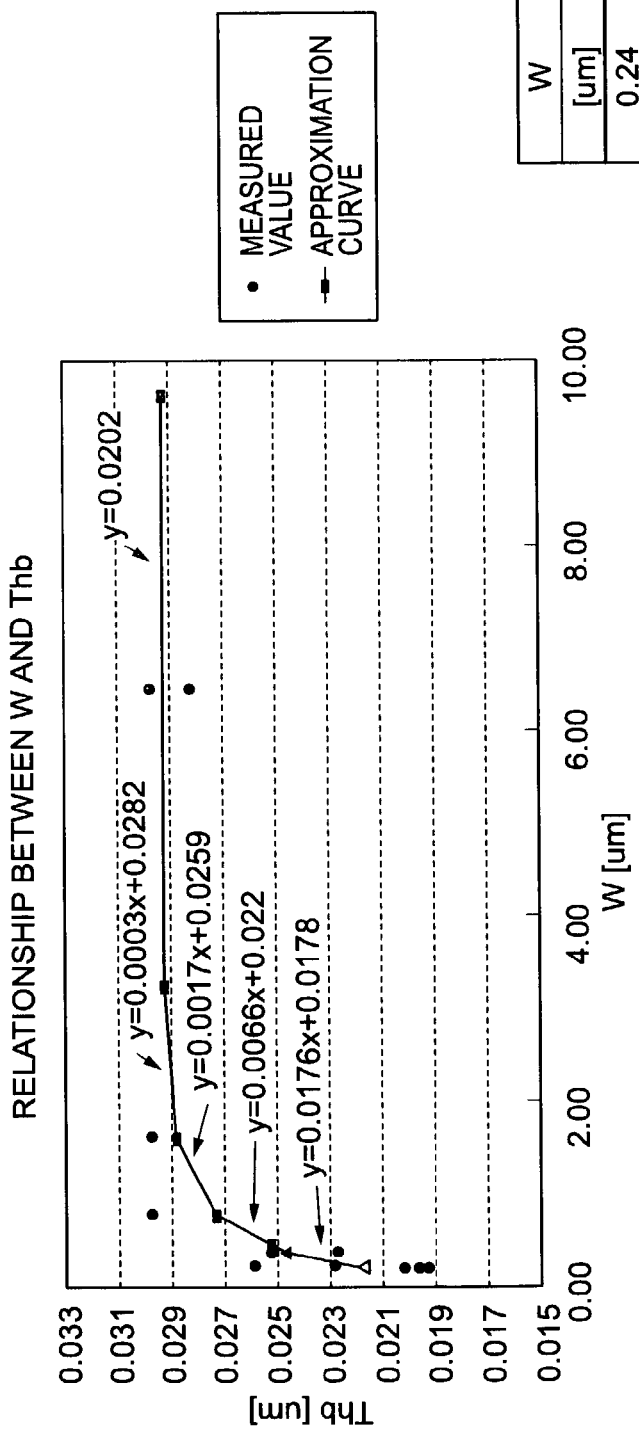
FIGS. 12A to 12C show a graph, model equations, and a table model for showing how a parameter Thb used for the embodiment of the present invention varies with wiring width W.

Next, modeling of the wiring cross-sectional profile based on the collected data will be described below. FIG. 7 shows a cross-sectional profile of an actual copper wiring and FIG. 8 shows a cross-section model of the copper wiring.

Figure 15A:
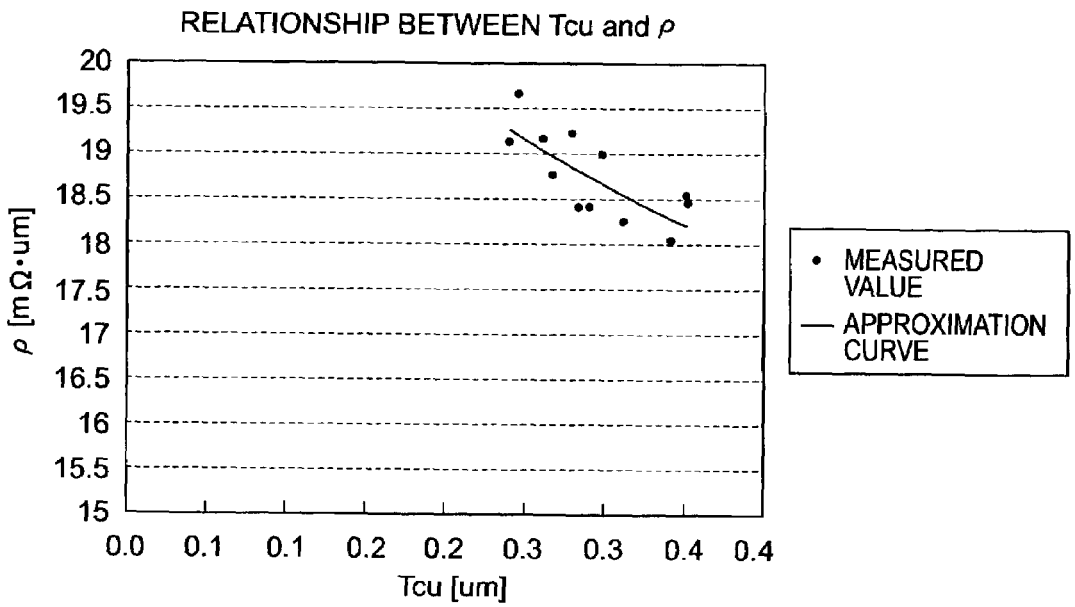
FIGS. 15A and 15B are graphs for showing how the resistivity ρ used for the embodiment of the present invention varies with parameters Tcu and Wcu.
Figure 15B:
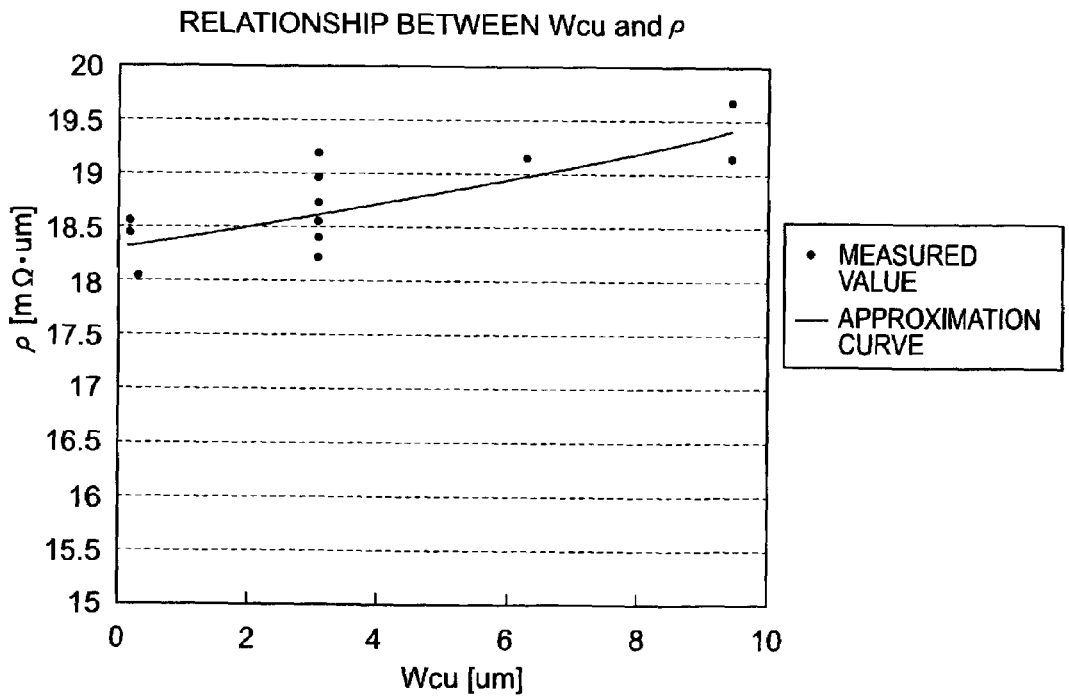

First, the area of the copper wiring core portion 110 for each sectionally observed pattern is read out. In this embodiment, since the side barrier metal portion 111 and the bottom barrier metal portion 112 contain a material having an extremely large resistance value, the resistance value of the side barrier metal portion 111 and the bottom barrier metal portion 112 may be negligible compared with the resistance of the core wiring core portion and the resistivity $\rho$ of the copper wiring core portion in this embodiment can be calculated by multiplying a wiring resistance measurement per unit length by the cross-sectional area of the copper wiring core portion. In this way, the resistivity of the copper wiring core portion is obtained for the sectionally observed pattern. With this embodiment, almost the same value has been obtained from any of the patterns, that is, it can be assumed that almost constant resistivities are obtained for wiring widths covered by this embodiment and thus, a mean value of these resistivities is considered as a model resistivity $\rho$. Although, from the above-mentioned reasons, the resistivity $\rho$ in this embodiment is assumed to have a fixed value, it will depend on the values of wiring width Wcu and wiring thickness Tcu for a state-of-the-art semiconductor device because of its finer structure, as shown in FIGS. 15A and 15B. Therefore, the resistivity $\rho$ may be generally given by a model equation and a table model as a function of Wcu and Tcu and the value Wcu (mean wiring width of the Cu portion (averaged in the direction of height)) can be expressed by the following equation:

$$Wcu=(W-2\times Ba-2\times Ts)+A\times Tcu$$

For the purpose of this embodiment, the table model refers to a table and scheme wherein parameter values calculated from the collected data are defined to be discrete with respect to a designed wiring width (W for this embodiment) and a value between discrete points is calculated from the discrete values through well-known linear interpolation.

From the actual cross-sectional profile in FIG. 7, the wiring thickness T on the wiring side is obtained by measuring the wiring cross-sectional profile and based on the wiring thickness T, such a trapezoid 116 that the inclination on the wiring side becomes a straight line most approximate to the actual one may be considered as an ideal wiring cross-sectional profile. This trapezoid is assumed to have straight lines connecting vertexes a, b, c, and d of the model in FIG. 8.

This trapezoidal approximation can determine a tapering amount Ba on one side with respect to layout size W of the wiring bottom and an inclination A (=B/C) on the wiring side in the model shape of FIG. 8 for each sectionally observed pattern.

The mean value read from the actual cross-sectional profile of FIG. 7 in terms of thickness of the side barrier metal 111 is assumed to be thickness Ths of the side barrier metal in the model shape of FIG. 8. In addition, the mean value read from the actual cross-sectional profile of FIG. 7 in terms of thickness of the bottom barrier metal 112 is assumed to be thickness Thb of the bottom barrier metal in the model shape of FIG. 8.

Thus determined values of Ba, A, Ths, and Thb for each sectionally observed pattern are plotted as graphs in FIGS. 9A, 10A, 11A, and 12A for several patterns of width W indicated as the X axis therein.

As can been seen from the plotted data, accurate approximation can be accomplished by giving the values Ba, A, Ths, and Thb as a function of W only.

FIGS. 9B, 10B, 11B, and 12B show model equations for expressing the values Ba, A, Ths, and Thb as a function of W.

FIGS. 9C, 10C, 11C, and 12C show table models for the values Ba, A, Ths, and Thb.

Figure 19A:
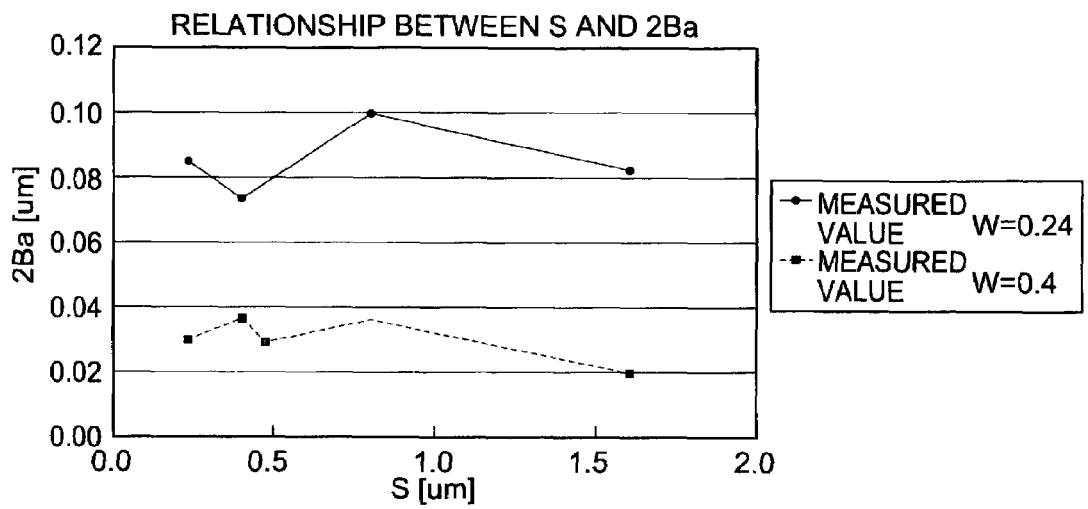
FIGS. 19A to 19C are graphs for showing how the parameters Ba, A, and Tt used for the embodiment of the present invention vary with wiring spacing S.
Figure 19B:
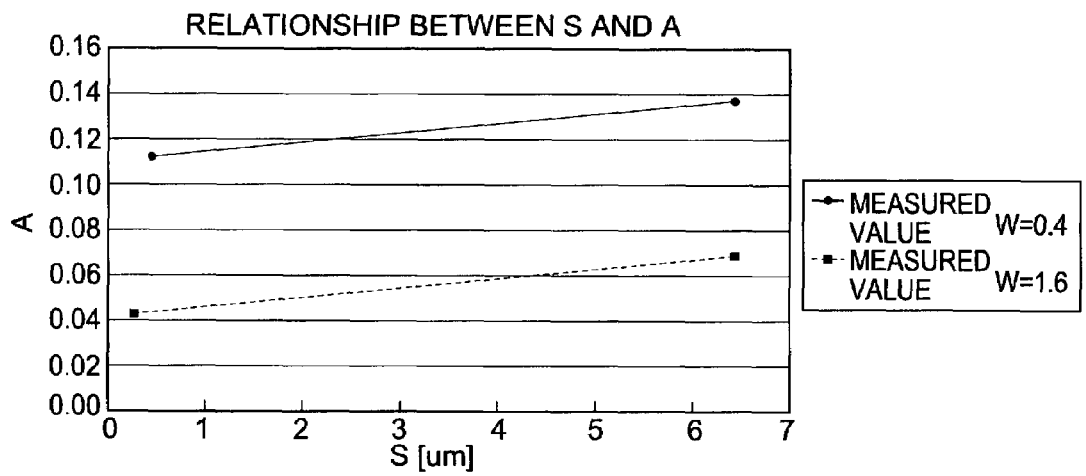

Although the values Ba, A, Ths, and Thb are modeled and tabulated as a function of W only in this embodiment, they may also depend on the value of spacing S between adjacent wirings for a state-of-the-art semiconductor device because of its finer structure. The values Ba and A can be expressed as a function of S as shown in FIGS. 19A and 19B, respectively. More generally, these values Ba and A may be given by model equations and table models as a function of W and S and the other values Ths and Thb may be given by those as a function of W.

For all test patterns, a mean thickness Tcu of the copper wiring core portion as shown in FIG. 8 is calculated from measured resistances and the values Ba, A, Ths, and Thb determined by the above-mentioned model equations and table models. Specifically, model values Ba and A for the cross-sectional profile in the model of FIG. 8 and a designed wiring width W are used to calculate the wiring sectional area modeled from the value Tcu and then, supposing that the calculated sectional area is equal to a measured sectional area of the copper wiring core portion used for calculating the resistivity $\rho$ (measured value), the value Tcu is obtained by solving the following equation:

$$[(W-2Ba)+(W-2Ba+(Tcu+Thb)\times A\times 2)]\times (Tcu+Thb)/2=\text{Measured sectional area}$$

This may allow for easy calculation of mean thickness Tcu of a copper wiring portion for all test patterns. The value Tcu in a measured pattern can be obtained from the model equations for the already determined values Ba, A, Ts, and Tb and the measured sectional area (in this case, the value Tcu is only for the measured pattern and the value Tcu for all patterns must be obtained separately). The resistivity $\rho$ can be expressed as a function of Tcu and Wcu by repeating the above-mentioned process for several test patterns. From thus created model equation $\rho$, the already created model equations for Ba, A, Ts, and Tb, and the measured resistances, the value Tcu can be obtained. It is an important point for this modeling process that the values Ba, A, Ts, Tb, and $\rho$ are obtained from the results of sectional observation made on several patterns and the value Tcu is obtained from these models and the measured resistances for all patterns.

Figure 16A:
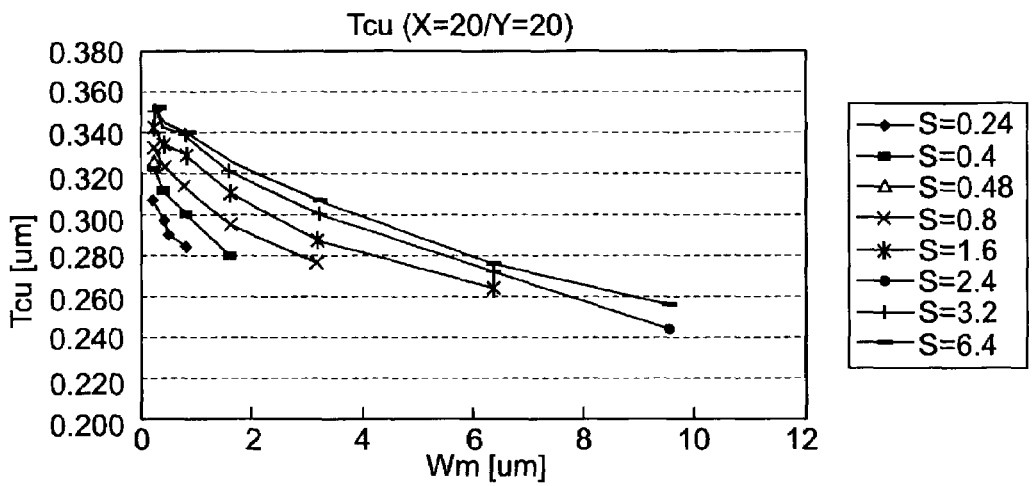
FIGS. 16A to 16C are graphs for showing how the parameter Tcu used for the embodiment of the present invention varies with wiring data region X×Y.
Figure 16B:
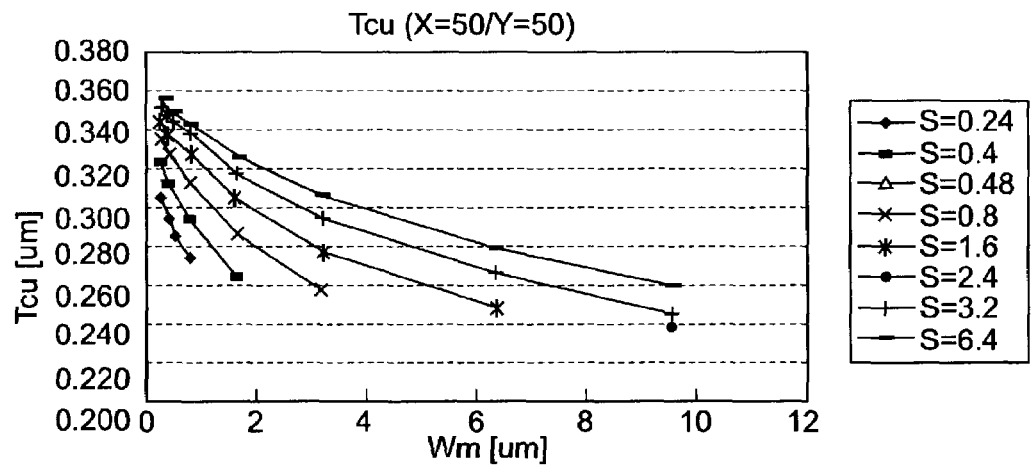
Figure 16C:
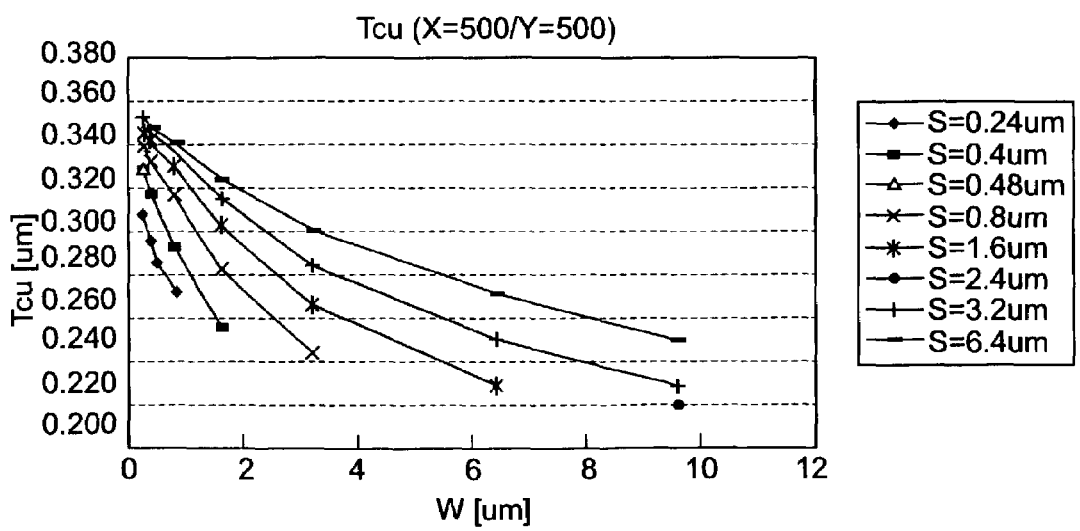

FIG. 16C shows the extracted data of Tcu for the test pattern 1 with X=500 µm and Y=500 µm. As shown, the mean thickness Tcu of the copper wiring core portion can be given by a model equation or table model as a function of W and S.

In this case, the sum of the bottom barrier metal thickness Thb and the mean thickness Tcu of the copper wiring core portion is not equal to the wiring thickness T on the wiring side in FIG. 7. This is because the copper wring core portion 110 and the bottom barrier metal 112 as shown in FIG. 7 do not have a uniform thickness and the copper wiring core portion 113 and the bottom barrier metal 115 as shown in the model of FIG. 8 are flattened. Therefore, a thickness compensation parameter Tt is introduced into the wiring cross-section model as shown in FIG. 8 so that the thickness of the wiring cross-section model is equal to a measured wiring thickness T. The thickness compensation parameter Tt is calculated by subtracting the wiring cross-section model values Thb and Tcu from the height T of the trapezoid 116 in FIG. 7 obtained from the sectionally observed test pattern. When the value Tt calculated from the thus obtained height T is plotted with the width W as the X axis, the resulting graph is as shown in FIG. 14A. As can been seen from the plotted data, accurate approximation can be accomplished in this embodiment by giving the value Tt as a function of W only. The model equation in terms of Tt expressed as a function of W is shown in FIG. 14B and the table model for W is shown in FIG. 14C.

Figure 19C:
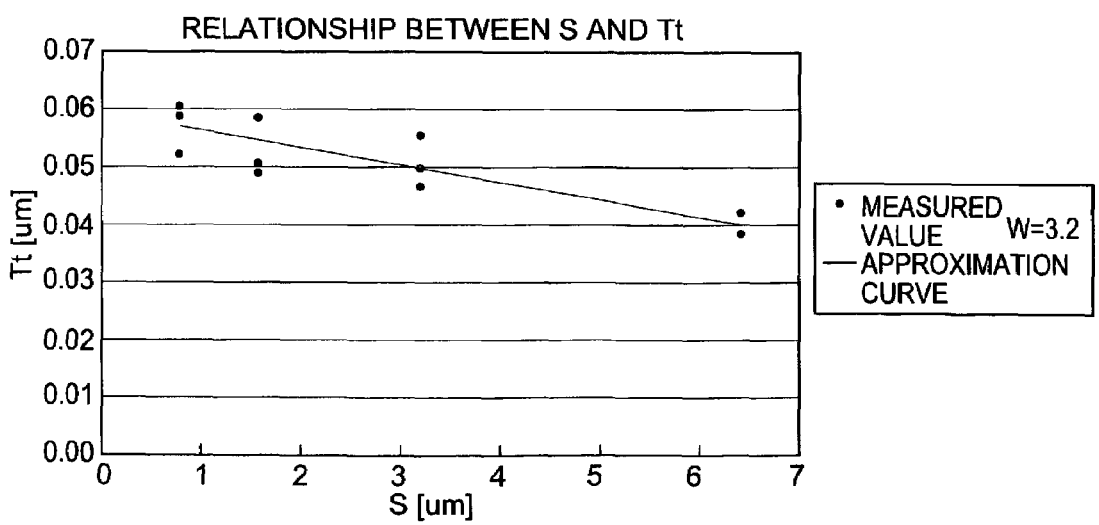

Although the value Tt is modeled and tabulated as a function of W only in this embodiment, it may also depend on the value of spacing S between adjacent wirings for a state-of-the-art semiconductor device because of its finer structure. More generally, this value Tt may be given by the model equation and table model as a function of W and S. In addition, the value Tt may be expressed as a function of S as shown in FIG. 19C. In this way, the wiring thickness T can be expressed as the sum of modeled values Tt, Tcu, and Thb.

Figure 13:
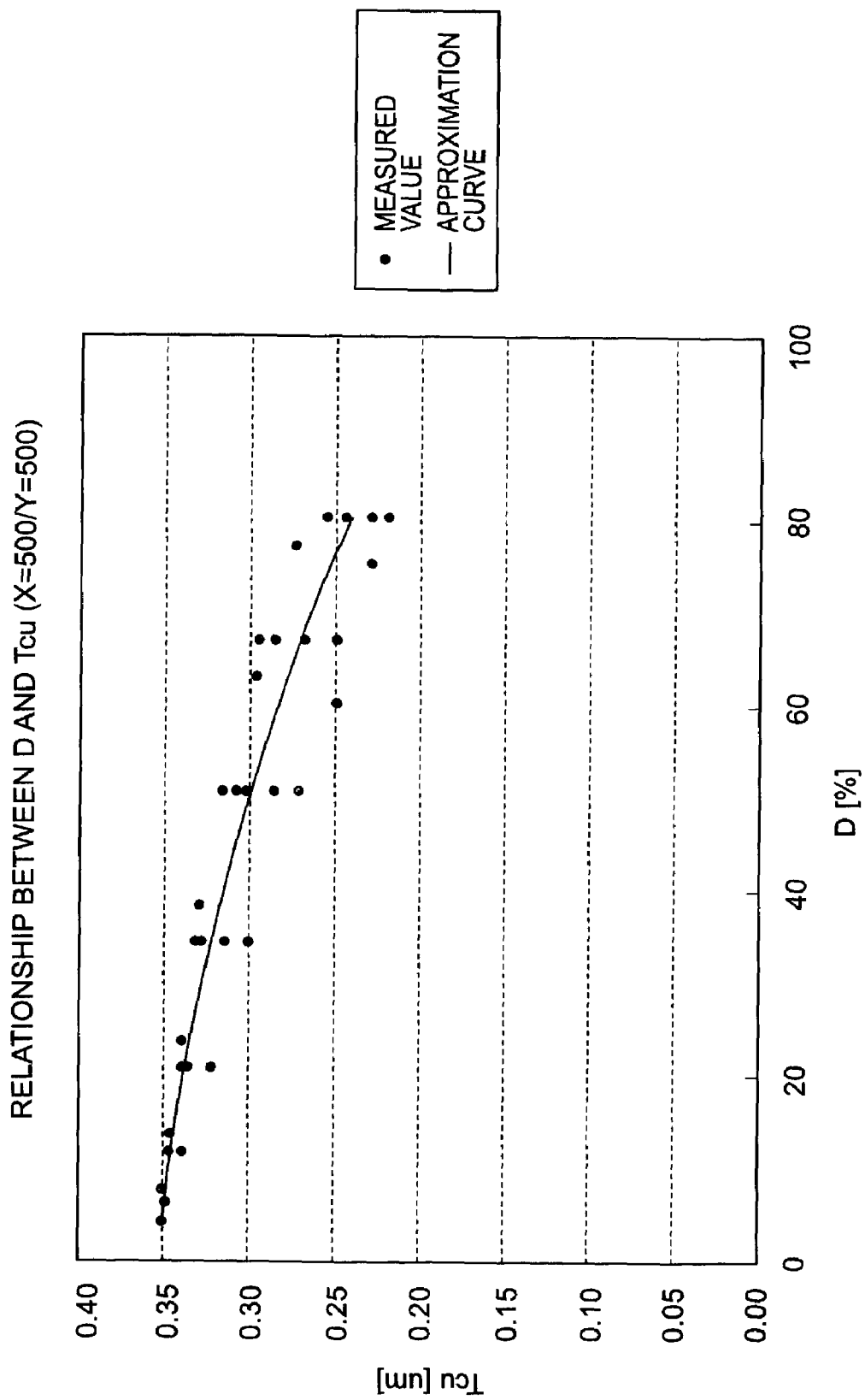
FIG. 13 is a graph for showing how a parameter Tcu used for the embodiment of the present invention varies with data ratio D.

Since the values ρ, Ba, A, Ths, and Thb depend on the values W and S only, just a few ones of all test patterns may be measured. However, in addition to the values W and S, the value Tcu also depends on all the values X, Y, W2, S2, and D which are circumferential conditions for layout and thus, it will necessitate data on many test patterns. For example, the value Tcu has D dependence as shown in FIG. 13. It can be seen from this graph that the larger wiring area may produce the thinner Tcu for X=Y=500 μm.

According to the above-mentioned flow, if several patterns with varying values W and S are sectionally observed and modeled to determine the values Ba, A, Ths, and Thb which only depend on wiring width (more generally, wiring width and wiring spacing between adjacent wirings) without any influence of the circumferential conditions for wiring layout, the results can be used to calculate the value Tcu, in addition to the values W and S, which depends on the layout circumferential conditions X, Y, W2, S2, and D, only from measured resistances obtained through automatic measurement without the need for much time and effort. The value Tt is a parameter used to adapt the sectional observation result to a measured value and it is determined by using the calculated model value of Tcu, so that an actual wiring cross-sectional profile can be approximated.

Now, determination of the values X, Y, and D necessary for calculating the value Tcu will be described below (for a product, the values X, Y, and D will be read out of the product layout for application of a Tcu model created from the test pattern).

First, byway of example, a portion of a product chip layout is shown in FIG. 17A, in which all the wirings are not shown because of their high density and wiring data regions 210, 220, 230, and 240 are surrounded by dotted lines to show the selection of such a region that contains a wiring 201 as an estimation target at the center thereof and other wirings on the periphery of the wiring 201. These regions 210, 220, 230, and 240 have the dimensions of X=Y=20 μm, X=Y=50 μm, X=Y=100 μm, and X=Y=200 μm, respectively. If a wiring data region is expanded gradually, the data ratio will be averaged and finally exhibit an almost fixed value. Therefore, although in fact it depends on the wiring width, it is recommendable that the wiring data region has the dimension of X=Y=2 mm at the maximum and this value depends on the wiring design rules. The maximum dimension is appropriately selected through a wiring layout process including the wiring rules to be used.

FIG. 17B shows an enlarged layout of the wiring data region 210. In the figure, a portion of the wiring 201 surrounded by a dotted line is assumed as an estimation target wiring. The length of this wiring portion is selected to be 0.1 to 10 μm according to the wiring design rules. If the wiring data region 210 is to be enlarged up to the wiring data regions 220, 230, and 240 in sequence, the wiring portion will become a starting point for enlargement.

FIG. 18 shows how the data ratio D varies with the dimension of the wiring data region, wherein the data ratio D used herein indicates a ratio of the total area of wirings to the area of a wiring data region when the wiring data region is enlarged from the estimation target wiring portion 201 as a starting point to the plurality of wiring data regions as described above. In this example, it is assumed that the wiring data region has the dimension of X=Y=200 μm at the maximum.

Figure 18A:
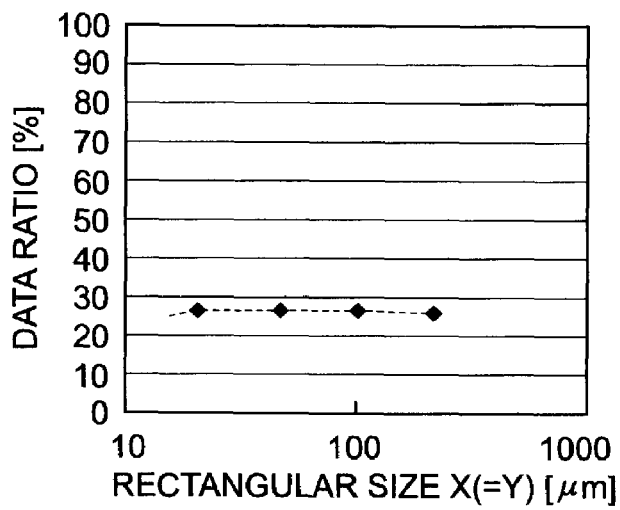
FIGS. 18A to 18C are graphs for explaining the process of determining the wiring data region and data ratio used for the embodiment of present invention.

FIG. 18A shows the case where the data ratio is substantially constant. As this case has the same conditions as those for a test pattern, the evaluation result for X=Y=200 μm can be used without further manipulation. Therefore, for the wiring portion 201, using the dimensions X and Y of 200 μm, the ratio of the total area of wirings to the area of this wiring data region can be determined as D.

Figure 18B:
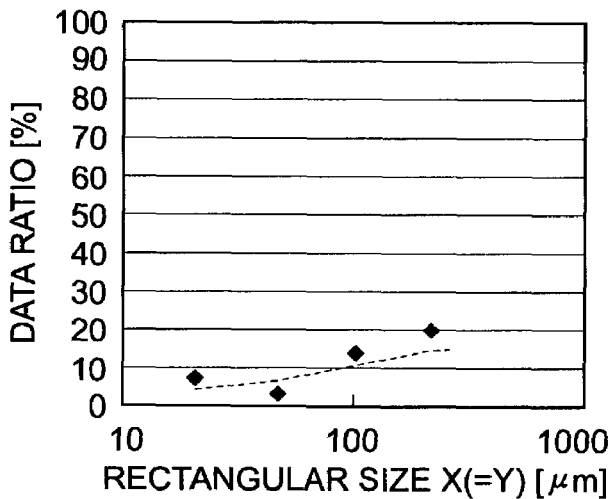

FIG. 18B shows the case where the data ratio varies in a slightly upward direction as a whole, while it is substantially constant in FIG. 18A. In this case, X=Y=50 μm and D=40% are determined as intermediate values.

Figure 18C:
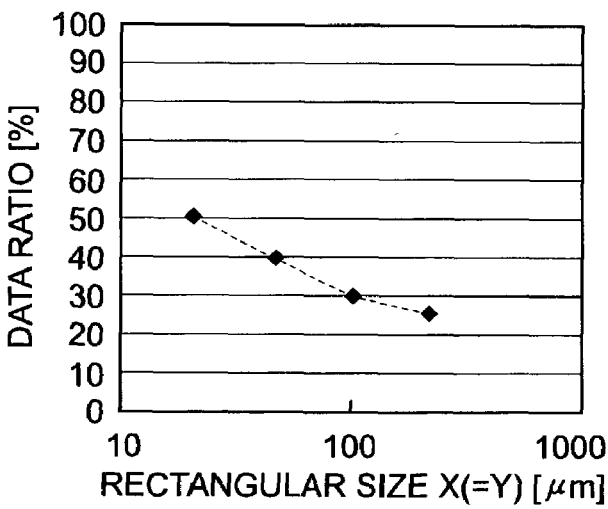

FIG. 18C shows the case where the data ratio varies in a downward direction as a whole, while it is substantially constant in FIG. 18A. In this case, X=Y=100 μm and D=20% are determined as intermediate values.

Although X is equal to Y in this example, it is needless to say that the above-mentioned process may apply to another case where X is not equal to Y. In addition, although this example uses aplurality of wiring data regions, each consisting of X and Y, the values of X and Y can be fixed values, respectively, according to the applicable wiring design rules. In this case, for each wiring portion, using the dimensions X and Y of these fixed values, the ratio of the total area of wirings to the area of that region is determined as D.

Alternatively, it is supposed that a whole chip has been divided into partitions of X=Y=200 μm in advance and one of these partitions including a target wiring portion is considered as a wiring data region for this wiring portion. Then, using the dimensions X and Y of 200 μm, the ratio of the total area of wirings to the area of that region is determined as D. Of course, the size of X and Y maybe changed to an optimum value according to the wiring design rules. If a target wiring portion is located near one edge of the partition in question, the accuracy maybe impaired in this case. Then new partitions are created by shifting the whole chip by 100 μm in the directions of both X and Y. As a result, there may be two partitions, that is, a previous one and a new one, that include a target wiring portion and the one which includes the target wiring portion at a location closer to the center thereof can be selected as a wiring data region.

The above-mentioned technique of dividing the whole chip in advance may be substituted by another technique of using several sizes of X and Y to be divided to determine the values X, Y, and D, taking into account the data ratio D which varies with wiring data regions.

If the whole chip is to be divided with fixed values as X and Y by the above-mentioned technique, the wirings on a layout may be divided into a plurality of rectangular blocks which have different sizes between 10 μm×10 μm and 2 mm×2 mm.

Extraction of data and wiring model for supporting the above-mentioned wiring modeling technique will be described below.

FIG. 16 shows how the value Tcu depends on the width W when the parameter S varies with D constant and X=Y=20 μm for FIG. 16A, D=constant and X=Y=50 μm for FIG. 16B, and D=constant and X=Y=500 μm for FIG. 16D. From these graphs, the value Tcu can be determined by giving a numerical table which contains a variable W or S with respect to varying values X and Y (D is constant).

Next, FIG. 13 shows how the value Tcu depends on the ratio D when the values W and S are constant with X=Y=500 μm. From this graph, the value Tcu can be determined by giving a numerical table which contains a variable W or S with respect to varying values X, Y, and D.

Next, FIG. 19 shows how the values Ba, A, and Tt depend on the spacing S when the values X, Y, and D are constant and the parameter W varies.

As described above, the resistance and parasitic capacitance of a wiring can be determined by determining the values X, Y, and D for the model in FIG. 8 and creating a numerical table for the values Ba, A, Ths, Thb, Tcu, and Tt with a varying parameter W or S (the remaining one is constant).

In particular, the wiring parasitic capacitance can be accurately extracted because the wiring thickness is specifically compensated so that the pattern including its barrier metal is formed in a trapezoidal shape which is most approximate to the actual wiring.

Figure 20A:
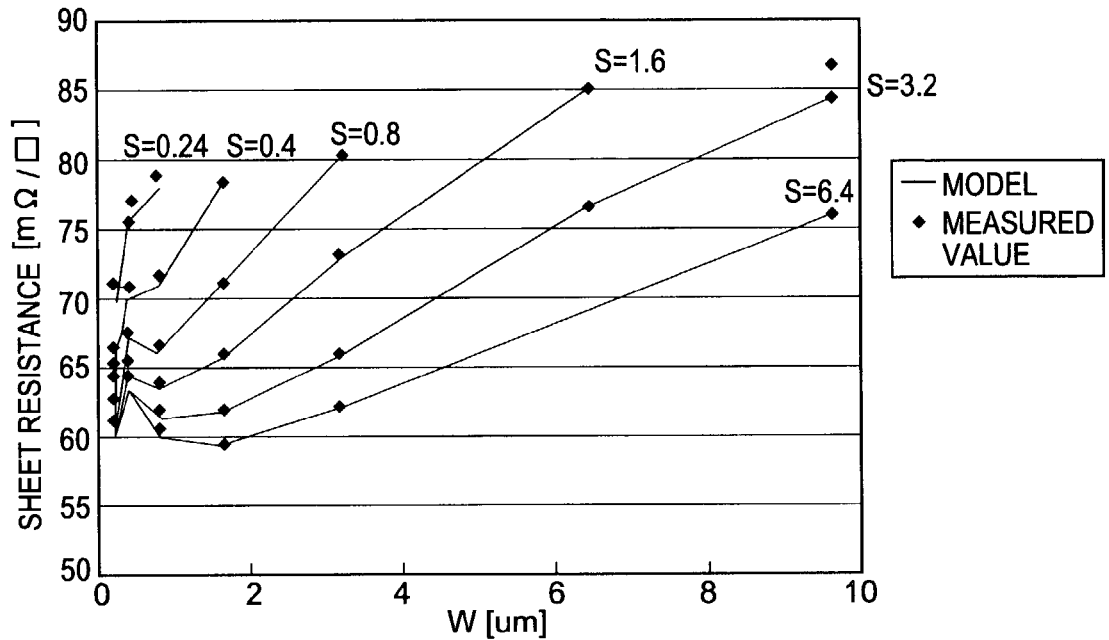
FIGS. 20A and 20B are graphs for explaining a difference between a wiring resistance obtained from a wiring model according to the embodiment of the present invention and another wiring resistance calculated without such a wiring model.
Figure 20B:
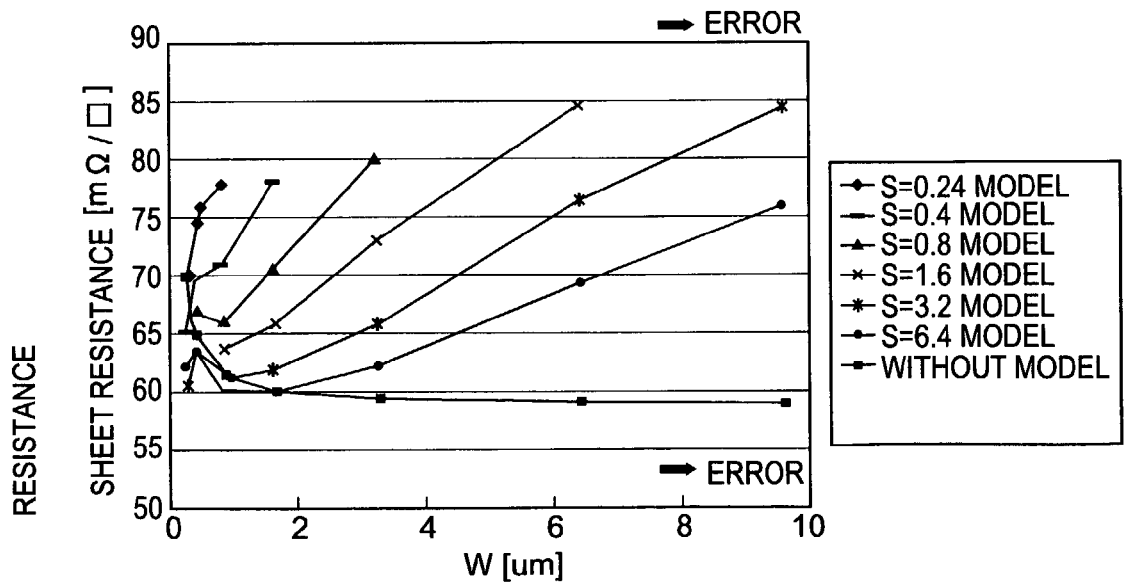

FIG. 20 shows estimated wiring resistances obtained by using the above-mentioned modeling technique, wiring models, and extraction of wiring models in comparison with those obtained without any model. Although a resistance obtained from a wiring model should match a measured resistance value because the wiring model is adapted to the measured resistance value, the fact can be confirmed by the graph in FIG. 20A. After the confirmation, wiring resistances obtained from a wiring model are compared with those obtained without any wiring model. These wiring resistances obtained without any wiring model have been calculated on the assumption that a tapering amount with respect to the wiring width W does not depend on the values W and S and that the wiring thickness is constant. Such comparison is shown in FIG. 20B. In FIG. 20, both of the wiring resistance are indicated as sheet resistance. As can be seen from FIG. 20B, the larger wiring width or the smaller wiring spacing may produce a larger deviation from those obtained without any wiring model.

The above-mentioned technique of using a model to estimate the capacitances and resistances of wiring portions can apply to software for automatically extracting such capacitances and resistances from certain existing layouts.

Now, a technique of compensating in advance the dimensions of a wiring layout formed on a mask based on the values Ba, A, and T obtained by model equations in masking the layout of an actual semiconductor device will be described below.

Model parameters are calculated in a similar manner to that for the technique of applying the actual shape to estimate the capacitances and resistances of wiring portions on the layout. A tapering amount on one side of the wiring as shown in FIG. 8 can be calculated by the equation Ba−T×A on the assumption that it is averaged in the direction of height. Finished dimensions of the actual semiconductor device with the tapering amount averaged in the direction of height can be compensated to the manufacturing aim by adding the calculated tapering amount to the wiring width before forming the layout on the mask.

From the foregoing, simplified estimation of wiring resistance or the like may be accomplished by expressing the values Ba, A, Ths, and Thb as a function of W according to the present invention and more accurate estimation may be accomplished with model equations or table models including wiring spacing S, wiring region dimensions X and Y, and wiring data ratio D in addition to wiring width W.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. In a semiconductor device having wirings, a wiring modeling technique comprising the steps of selecting an arbitrary region of said semiconductor device; calculating a wiring area ratio of said wirings to said region; and determining said region and said wiring area ratio to model the cross-sectional profile of a target wiring located in the middle of said region.

2. The wiring modeling technique according to claim 1, wherein if said wiring area ratio varies with changes of said region in a certain direction when said region is uniformly expanded or reduced by a predetermined distance with said target wiring located at the center, an intermediate value between the maximum and the minimum of said wiring area ratio with respect to said predetermined distance is determined as a wiring area ratio of said target wiring and a region corresponding to said wiring area ratio of said target wiring is determined as a region for said target wiring.

3. In a semiconductor device having wirings, a wiring modeling technique comprising the steps of dividing said wirings into a plurality of wiring regions on said semiconductor device; calculating a wiring area ratio of wirings contained in each of said wiring regions to said wiring region; and determining said plurality of wiring regions and the wiring area ratios corresponding to said plurality of wiring regions to model the cross-sectional profile of wirings contained in each of said plurality of wiring regions.

4. In a semiconductor device having wirings, a wiring modeling technique comprising the steps of selecting a rectangular region of said semiconductor device to limit wirings contained in said rectangular region; calculating a wiring area ratio of said wirings to said rectangular region; and determining said rectangular region and said wiring area ratio to model the cross-sectional profile of wirings contained in said rectangular region.

5. In a semiconductor device having wirings, a wiring modeling technique comprising the steps of limiting a wiring of said semiconductor device as a target wiring; confining a certain rectangular region with a target wiring portion on said target wiring being located at the center thereof; calculating a wiring area ratio of wirings contained in said rectangular region to said rectangular region; determining said rectangular region and said wiring area ratio to model the cross-sectional profile of said target wiring portion; subsequently confining said certain rectangular region with another target wiring portion at a predetermined distance from the target wiring portion on said target wiring being located at the center thereof; calculating a wiring area ratio of wirings contained in said rectangular region to said rectangular region; determining said rectangular region and said wiring area ratio to model the cross-sectional profile of said another target wiring portion; repeating said modeling operation for each portion at said predetermined distance on said target wiring to complete a one-dimensional modeling operation for said target wiring; repeating, for an adjacent target wiring next to said target wiring, the same modeling operation as the one-dimensional modeling operation for said target wiring to complete a one-dimensional modeling operation for said adjacent target wiring; and performing said one-dimensional modeling operation on all wirings to complete a two-dimensional modeling operation for the wirings of said semiconductor device.

6. The wiring modeling technique according to claim 4 or 5, wherein said rectangular region has an area between 10 $\mu m^2$ and 10 $mm^2$.

* * * * *